United States Patent
McCutcheon et al.

(10) Patent No.: US 9,827,757 B2
(45) Date of Patent: Nov. 28, 2017

(54) METHODS OF TRANSFERRING DEVICE WAFERS OR LAYERS BETWEEN CARRIER SUBSTRATES AND OTHER SURFACES

(75) Inventors: Jeremy McCutcheon, Rolla, MO (US); Tony D. Flaim, St. James, MO (US); Susan Bailey, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 768 days.

(21) Appl. No.: 14/131,157

(22) PCT Filed: Jul. 9, 2012

(86) PCT No.: PCT/US2012/045980
§ 371 (c)(1),
(2), (4) Date: Jan. 6, 2014

(87) PCT Pub. No.: WO2013/006865
PCT Pub. Date: Jan. 10, 2013

(65) Prior Publication Data
US 2014/0130969 A1    May 15, 2014

Related U.S. Application Data

(60) Provisional application No. 61/505,196, filed on Jul. 7, 2011, provisional application No. 61/547,928, filed on (Continued)

(51) Int. Cl.
| | | |
|---|---|---|
| B29C 65/48 | (2006.01) | |
| B32B 9/04 | (2006.01) | |
| B32B 37/12 | (2006.01) | |
| B32B 37/16 | (2006.01) | |
| B32B 38/10 | (2006.01) | |

(Continued)

(52) U.S. Cl.
CPC ............ B32B 38/10 (2013.01); B32B 7/06 (2013.01); B32B 7/12 (2013.01); B32B 7/14 (2013.01);
(Continued)

(58) Field of Classification Search
USPC ........ 156/247, 249, 701, 744; 428/138, 201, 428/408, 425.5, 448, 451
See application file for complete search history.

(56) References Cited

U.S. PATENT DOCUMENTS 6,214,733 B1    4/2001    Sickmiller
6,495,224 B1 *  12/2002   Dutton ................ B29C 61/0616
                                                         427/123

(Continued)

OTHER PUBLICATIONS

International Search Report dated Jan. 21, 2013 in corresponding PCT/US2012/045980 filed on Jul. 9, 2012.

*Primary Examiner* — Sing P Chan
(74) *Attorney, Agent, or Firm* — Hovey Williams LLP

(57) ABSTRACT

New temporary bonding methods and articles formed from those methods are provided. In one embodiment, the methods comprise coating a device or other ultrathin layer on a growth substrate with a rigid support layer and then bonding that stack to a carrier substrate. The growth substrate can then be removed and the ultrathin layer mounted on a final support. In another embodiment, the invention provides methods of handling device layers during processing that must occur on both sides of the fragile layer without damaging it. This is accomplished via the sequential use of two carriers, one on each side of the device layer, bonded with different bonding compositions for selective debonding.

28 Claims, 5 Drawing Sheets

Related U.S. Application Data on Oct. 17, 2011, provisional application No. 61/621,460, filed on Apr. 6, 2012.

(51) Int. Cl.
*B32B 43/00* (2006.01)
*H01L 21/683* (2006.01)
*B32B 7/06* (2006.01)
*B32B 7/12* (2006.01)
*B32B 7/14* (2006.01)
*H01L 21/20* (2006.01)

(52) U.S. Cl.
CPC ........ *B32B 43/006* (2013.01); *H01L 21/2007* (2013.01); *H01L 21/6835* (2013.01); *B32B 2457/14* (2013.01); *H01L 2221/6834* (2013.01); *H01L 2221/68318* (2013.01); *H01L 2221/68327* (2013.01); *H01L 2221/68368* (2013.01); *H01L 2221/68381* (2013.01); *Y10T 156/11* (2015.01); *Y10T 428/24331* (2015.01); *Y10T 428/24851* (2015.01); *Y10T 428/30* (2015.01); *Y10T 428/31598* (2015.04); *Y10T 428/31667* (2015.04)

(56) References Cited

U.S. PATENT DOCUMENTS

| | | | |
|---|---|---|---|
| 7,292,381 B1 * | 11/2007 | Patterson | ............ H01L 21/6835 257/723 |
| 7,585,703 B2 * | 9/2009 | Matsumura | ........... G02F 1/1362 257/E27.132 |
| 2003/0113984 A1 * | 6/2003 | Okada | ..................... B24B 7/228 438/459 |
| 2005/0095813 A1 * | 5/2005 | Zhu | ..................... B81C 1/00182 438/459 |
| 2008/0280416 A1 | 11/2008 | Bedell et al. | |
| 2009/0035590 A1 | 2/2009 | Sullivan et al. | |
| 2009/0218560 A1 | 9/2009 | Flaim et al. | |
| 2010/0006858 A1 | 1/2010 | Sung | |
| 2010/0112305 A1 | 5/2010 | Hong et al. | |
| 2011/0069467 A1 | 3/2011 | Flaim et al. | |
| 2011/0114965 A1 | 5/2011 | Letertre | |
| 2011/0308739 A1 | 12/2011 | McCutcheon et al. | |
| 2012/0015163 A1 * | 1/2012 | He | ..................... H01L 21/6835 428/212 |
| 2012/0034437 A1 | 2/2012 | Puligadda et al. | |
| 2013/0011997 A1 | 1/2013 | Burggraf et al. | |

* cited by examiner

METHODS OF TRANSFERRING DEVICE WAFERS OR LAYERS BETWEEN CARRIER SUBSTRATES AND OTHER SURFACES

RELATED APPLICATIONS

The present application claims priority to PCT International Patent Application No. PCT/US2012/045980, filed Jul. 9, 2012, which, claims the priority benefit of the following U.S. Provisional Applications: No. 61/505,196, filed Jul. 7, 2011, entitled PROCESS FOR TRANSFERRING A DEVICE SUBSTRATE FROM ONE TEMPORARY CARRIER TO A SECOND TEMPORARY CARRIER; No. 61/547,928, filed Oct. 17, 2011, entitled PROCESS FOR TRANSFERRING A DEVICE SUBSTRATE FROM ONE TEMPORARY CARRIER TO A SECOND TEMPORARY CARRIER; and No. 61/621,460, filed Apr. 6, 2012, entitled MATERIAL AND PROCESS FOR SUPPORT LAYER FOR ULTRATHIN MATERIALS. Each of these applications is incorporated by reference herein.

BACKGROUND OF THE INVENTION

Field of the Invention

The present invention is broadly concerned with novel temporary wafer bonding and debonding methods that support a device or other ultrathin layer during thinning, transfer, and/or backside processing, as well as structures resulting from those methods.

Description of the Prior Art

Advances in technology, such as epitaxial layer growth through metalorganic chemical vapor deposition (MOCVD) and dice-before-grind (DBG) processing have created the need for new methods to handle ultrathin materials. Epitaxial layers, such as gallium nitride and aluminum gallium indium phosphide are typically grown 10-µm to 25-µm thick on a fall thickness growth substrate that is typically formed of sapphire, gallium arsenide, or germanium wafer. While this approach is convenient, it is often advantageous to remove the epitaxial layers from the growth substrate. While there are several methods to separate the epitaxial layer from the growth substrate, including diamond wheel grinding, wet chemical etch, and laser lift-off (LLO), methods for handling the separated layer are inadequate. In the case of DBG processing, it is necessary to support the pre-diced wafers as they are thinned, while allowing separation after thinning.

Currently, there are no known robust, cost-effective solutions for the handling of these ultrathin materials, and certainly no known methods for epitaxial layer handling. Some methods do exist for handling thin wafers. In many cases, the thin wafers (usually silicon) are temporarily bonded to a carrier, such as a standard glass or silicon wafer. These wafer pairs are bonded, usually by a polymeric material, which can then be removed by a heat or chemical treatment. However, these processes cannot be applied directly to ultrathin materials, such as epitaxial layers. The materials developed for thin silicon bonding were designed to flow at bonding temperatures of around 180° C. At this temperature, flowing is not acceptable for ultrathin material handling. Thinned wafers that are about 50-µm thick can bend, but are basically rigid, and therefore will remain flat during a thermal cycle that allows the bonding material to flow. Free-standing epitaxial layers are so thin that they lack the rigidity required to be self-supporting. If the bonding material is able to flow, the layer will relieve any stress by forming wrinkles or other distortions. This is especially problematic with heteroepitaxial systems that, due to lattice mismatches and differing CTE from layer to layer, are loaded with stress.

As an additional challenge, separation techniques used to remove epitaxial layers from their growth substrates can be highly traumatic. Laser lift-off can involve extremely high local temperatures, and bulk chemical etch processes can be harsher than processes typically encountered with typical silicon wafer processing. Current methods utilize materials that are difficult to separate from the carrier wafer and are not readily cleanable from the ultrathin epitaxial layer.

The present invention overcomes the problems of the prior art by decoupling the requirements of bonding and support by using a multi-layer or multi-functional system.

SUMMARY OF THE INVENTION

A method of handling ultrathin layers is provided. The method comprises providing an active stack bonded with a carrier stack. The active stack comprises: a growth substrate having front and back surfaces; an ultrathin layer having first and second surfaces, where the first surface is in contact with the front surface; and a reinforcing carrier material adjacent the second surface. The carrier stack comprises: a carrier substrate having a carrier surface, a peripheral region, and a central region; and a bonding composition adjacent the carrier surface. The bonding composition of the carrier stack is in contact with the reinforcing material of the active stack. Finally, the growth substrate is separated from the ultrathin layer.

The invention is also directed towards a structure formed by this method.

In another embodiment, the invention provides a method of transferring a device layer between carrier substrates. The method comprises providing a stack comprising:
a device layer having first and second sides;
a first carrier substrate having a first surface that is bonded to the first side via a first bonding layer, the first carrier substrate having a first central region and a first peripheral region, the first peripheral region comprising a first edge mask that is formed of a material that is different from the first bonding layer; and
a second carrier substrate having a second surface that is bonded to the second side via a second bonding layer, the second carrier substrate having a second central region and a second peripheral region, the second peripheral region comprising a second edge mask that is formed of a material that is different from the second bonding layer.

The first carrier substrate is then separated from the device layer by disrupting the first bonding layer, the first edge mask, or both.

The invention is also directed towards a structure formed by this method.

DETAILED DESCRIPTION OF THE PREFERRED EMBODIMENTS

Figure 1:
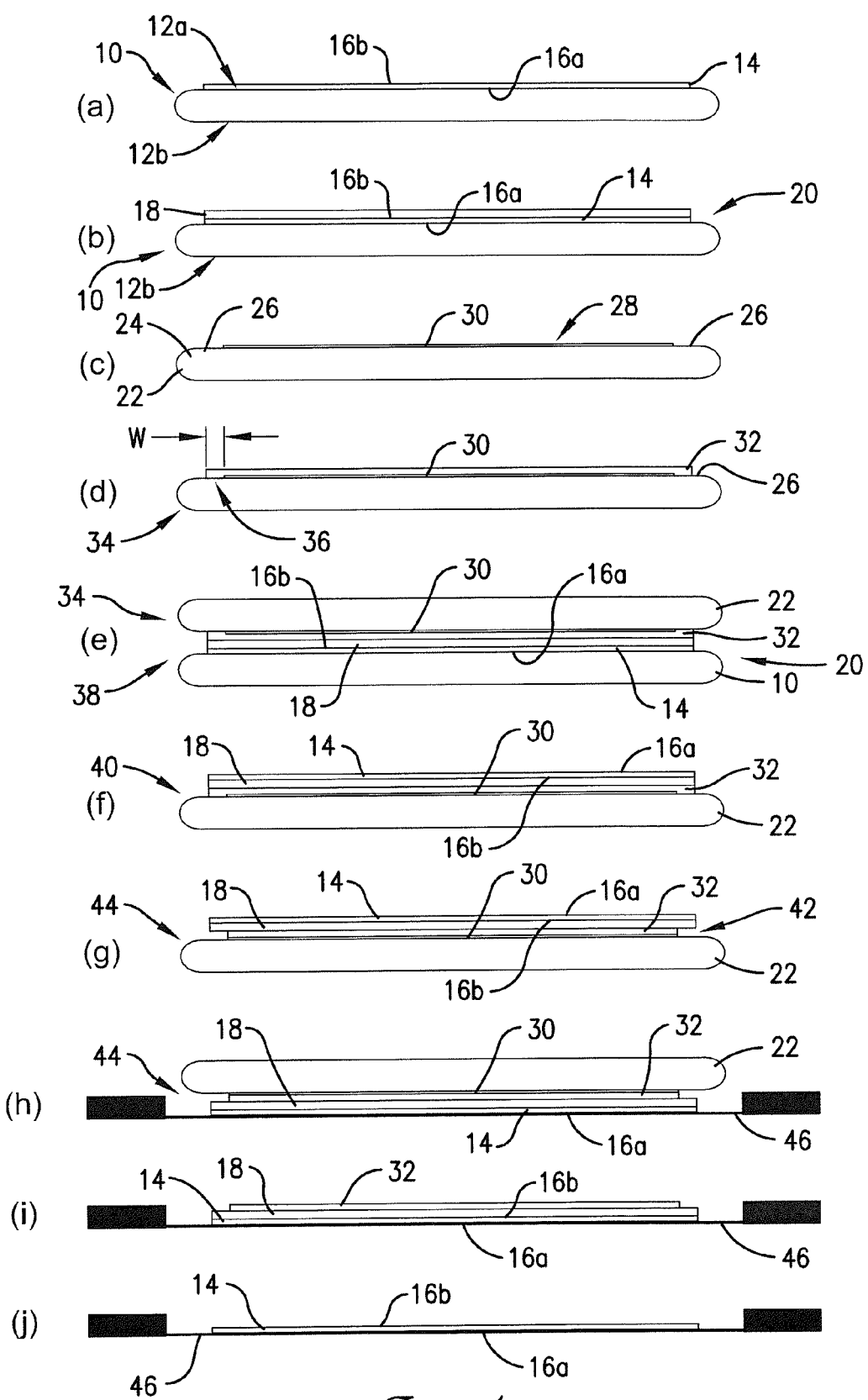
FIG. 1 is a schematic figure showing a wafer or ultrathin layer handling process according to the invention.

Referring to FIG. 1(a), a growth substrate 10 having front and back surfaces 12a, 12b is provided. Growth substrate 10 is preferably made of a material selected from the group consisting of sapphire, silicon, gallium arsenide, germanium, and silicon carbide.

Growth substrate 10 includes an ultrathin layer 14 on its front surface 12a. More specifically, ultrathin layer 14 has first and second surfaces 16a, 16b, and first surface 16a is in contact with front surface 12a of growth substrate 10. Ultrathin layer 14 is preferably selected from the group consisting of device layers, epitaxial layers, dicing streets, and graphene. Typical device layers include those selected from the group consisting of silicon, gallium nitride, silicon carbide, germanium, and aluminum nitride. Exemplary epitaxial layers include those selected from the group consisting of epitaxial gallium arsenide, indium phosphide, gallium nitride, silicon, and silicon oxide. Ultrathin layer 14 can be formed on growth substrate 10 according to conventional methods for the particular type of ultrathin layer 14. Ultrathin layer 14 will typically have an average thickness of less than about 100 µm, less than about 50 µm, and even less than about 10 µm. The average thickness suitable with the present method can be as low as about 10-15 Å.

As shown in FIG. 1(b), a reinforcing material 18 is formed on second surface 16b of ultrathin layer 14, forming active stack 20. Reinforcing material 18 is preferably a polymeric or oligomeric composition, and can be spin-applied, laminated, sprayed, jetted, or applied by any other conventional method onto ultrathin layer 14, followed by typical baking and/or drying that is required by the particular method chosen. The composition of reinforcing material 18 is chosen to adhere well to the ultrathin layer 14/growth substrate 10 as well as to the bonding material (described below). Furthermore, reinforcing material 18 provides structural support for the ultrathin material after separation from the growth substrate 10. It should stay rigid and adherent throughout separation and wafer processing, and should be easily and completely removed from ultrathin layer 14/growth substrate 10 after final bonding, or when otherwise desired. Suitable materials for the rigid support layer are selected from the group consisting of polysulfones, polyimides, acrylates, polyacrylates, polyhydroxyethers, polyurethanes, urethanes, polyethersulfones, and composites of the foregoing. The average thickness of the final layer of reinforcing material 18 will typically be from about 100 µm to about 400 µm, preferably from about 150 µm to about 350 µm, and more preferably from about 200 µm to about 300 µm.

As shown in FIG.(c), a carrier substrate 22 is provided. Typical carrier substrates 22 can be formed from a material selected from the group consisting of sapphire, silicon, gallium arsenide, germanium, silicon carbide, glass, metals, and composites of the foregoing. Carrier substrate 22 has a carrier surface 24, a (typically annular) peripheral region 26, and a (typically circular) central region 28. In the embodiment shown, carrier substrate 22 includes a low stiction zone 30 on carrier surface 24, in central region 28. However, low stiction zone 30 is optional, and some embodiments will not include a low stiction zone 30. The low stiction zone 30 will preferably have an adhesive strength of less than about 50 psig, more preferably less than about 35 psig, and even more preferably from about 1 psig to about 30 psig. As used herein, adhesive strength is determined by ASTM D4541/D7234. Low stiction zone 30 can be a modification of carrier surface 24, a polymeric or oligomeric fill layer, or any other type of low adhesive strength area, provided it is selected so that it doesn't interact unfavorably with the other layers described herein.

Examples of suitable polymeric materials for use as low stiction zone 30 include some cyclic olefin polymers and copolymers sold under the names APEL® by Mitsui, TOPAS® by Ticona, and ZEONOR® by Zeon brands, and solvent-soluble fluoropolymers such as CYTOP® polymers sold by Asahi Glass and TEFLON® AF polymers sold by DuPont. The bonding strength of these materials will depend upon the coating and baking conditions used to apply them. When a polymeric or oligomeric fill layer is used, typical thicknesses of the layer at low stiction zone 30 will be from 0.01 µm to about 30 µm.

Examples of suitable surface modifications may include, for example: (a) chemical treatment of a silicon surface with a hydrophobic organosilane such as a (fluoro)alkyl silane (e.g., perfluoroalkyltrichlorosilane) or a (fluoro)alkyl phosphonate to reduce its surface free energy; or (b) chemical vapor deposition of a low surface free energy coating (e.g., fluorinated parylenes or parylene AF4) onto the carrier to create a permanent non-stick surface. When a surface modification is carried out, the thickness of the layer at low stiction zone 30 will generally be on the order of from about 1 nm to about 5 nm.

A bonding composition 32 is then applied to low stiction zone 30 to form carrier stack 34, as shown in FIG. 1(d). Bonding composition 32 can be formed from any of a number of commercially available temporary bonding materials. The bonding composition 32 is preferably spin-applied, but could also be applied by lamination, spray, or jetting, followed by any baking or drying that is conventional for the particular application method selected. The material chosen for bonding composition 32 should be selected so that it maintains a strong bond at the processing temperatures required for the bonded substrates. The temporary bonding material must be able to adhere to the reinforcing material 18, as well as to any other bonding materials or carrier substrates. Suitable materials for the bonding composition 32 include cyclic polyolefin polymers and copolymers, ZoneBOND® materials (available from Brewer Science Inc., Rolla, Mo.), WaferBOND® materials (available from Brewer Science Inc., Rolla, Mo.), high solids, UV-curable resin systems, and thermoplastic acrylic, styrenic, vinyl halide (non-fluoro-containing), and vinyl ester polymers and copolymers along with polyamides, polyimides, polysulfones, polyethersulfones, and polyurethanes.

The adhesive strength of bonding composition 32 should be greater than about 50 psig, preferably from about 80 psig to about 250 psig, and more preferably from about 100 psig to about 150 psig. In addition, the adhesive strength of bonding composition 32 is at least about 0.5 psig, preferably at least about 20 psig, and more preferably from about 50 psig to about 250 psig greater than the adhesive strength of low stiction zone 30, when present, or of central region 28 of carrier 22 when low stiction zone 30 is not present.

As shown in FIG. 1(d), (typically annular) segment 36 of bonding composition 32 extends beyond the low stiction zone 30, into the peripheral region 26 of carrier 22. In such instances, it is preferred that segment 36 have a width "W" of from about 0.1 mm to about 10 mm, and more preferably from about 0.5 mm to about 5 mm. The average thickness of the layer of bonding composition 32 is from about 5 μm to about 100 μm, preferably from about 10 μm to about 50 μm, and more preferably from about 15 μm to about 30 μm.

Referring to FIG. 1(e), the active stack 20 is then bonded to the carrier stack 34 under sufficient temperatures and pressures to cause the bonding composition 32 to adhere to and with the reinforcing material 18, and form bonded stack 38. Typical bonding temperature ranges are from about 50° C. to about 300° C., and preferably from about 100° C. to about 250° C. Typical bonding pressure ranges are from about 5 N to about 50,000 N, and preferably from about 50 N to about 5,000 N. Bonding is preferably carried out under a vacuum as well.

Next, as shown in FIG. 1(f), the growth substrate 10 is removed from bonded stack 38 by any known method (e.g., grinding, etching, laser lift-off, photolithography, sputtering, plasma enhanced chemical vapor deposition, epi layer transfer or "ELTRAN") to yield intermediate stack 40. Segment 36 can then be mechanically, thermomechanically, or chemically disrupted to yield recessed area 42 (structure 44 of FIG. 1(g)). Structure 44 can then be flipped and mounted on a support 46 (e.g., film frame, final substrate, temporary carriers, vacuum chuck, electrostatic chuck) so that first surface 16a of ultrathin layer 14 is in contact with the support 46. Carrier 22 is then removed (FIG. 1(i)) and any remaining bonding composition 32 and reinforcing material 18 can be cleaned off of the mounted ultrathin layer 14 with solvent to leave ultrathin layer 14 on its final support 46.

It will be appreciated that the above order of layer formation and/or bonding can be altered, if desired. For example, while the above description shows the bonding composition 32 is applied to carrier 22 before bonding of the carrier stack 34 to active stack 20, it is also possible to apply bonding composition 32 directly to reinforcing material 18, and then bond carrier 22 to active stack 20. This variation is not shown in the figures, but it will be readily understood by one of ordinary skill in the art.

Figure 2:
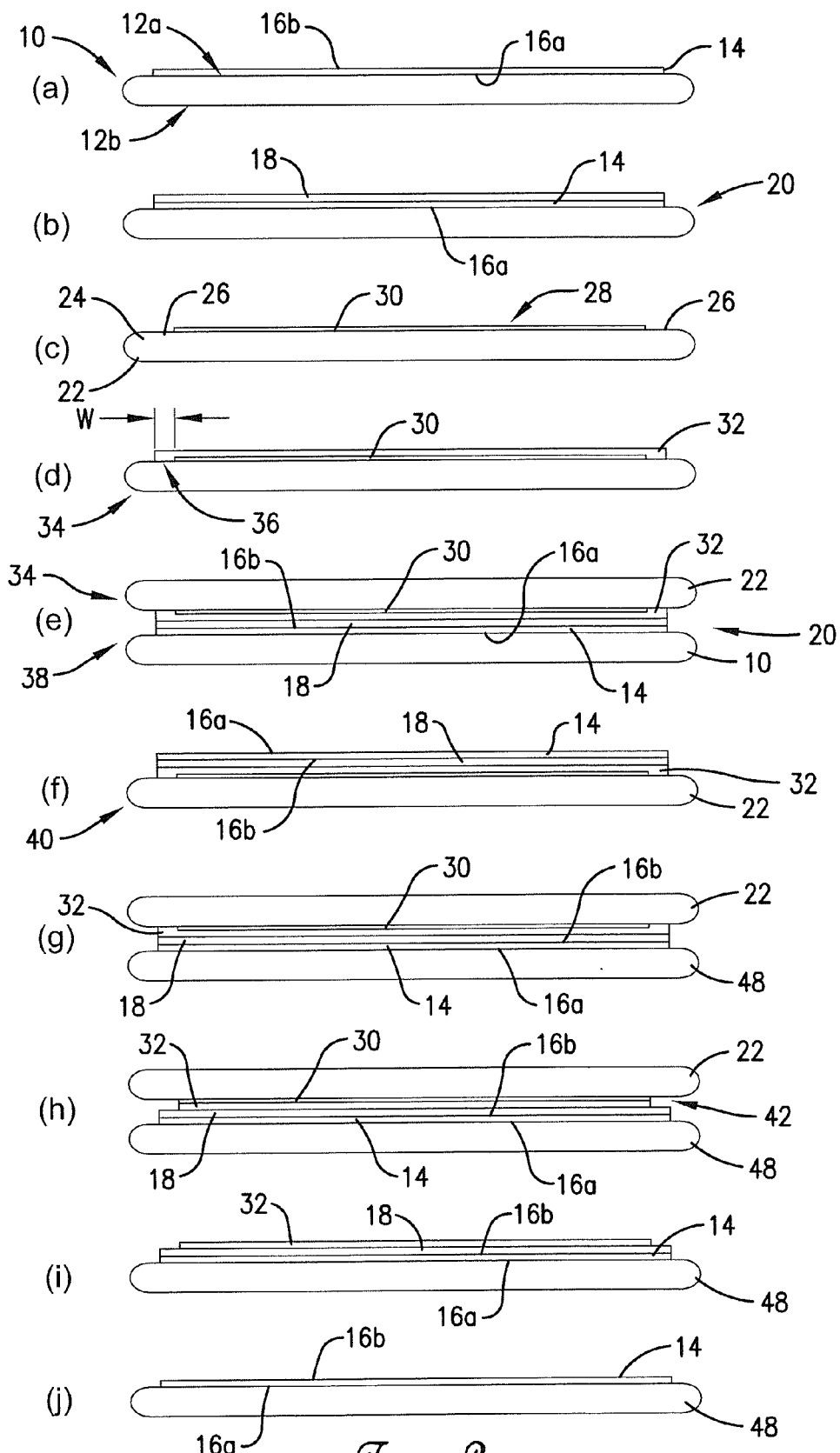
FIG. 2 is a schematic figure showing a variation of the wafer handling process of FIG. 1.

An alternative embodiment of the invention is shown in FIG. 2, where like numbering with FIG. 1 indicates that the description of those parts, steps, etc., as described above applies to the embodiment of FIG. 2, unless noted otherwise. FIGS. 2(a)-2(f) are identical to the process described above with respect to FIGS. 1(a)-1(f). Referring to FIG. 2(g), intermediate stack 40 is flipped and mounted on a final substrate 48, again so that first surface 16a of ultrathin layer 14 is in contact with the final substrate 48. Final substrate 48 can be, for example, silicon, glass, metals, or polymeric. Segments 36 are then removed as described previously and as shown in FIG. 2(h), followed by separation of carrier 22 (FIG. 2(i)), and cleaning off of remaining bonding composition 32 and reinforcing carrier material 18 (FIG. 2(j)), all as described previously.

Figure 3:
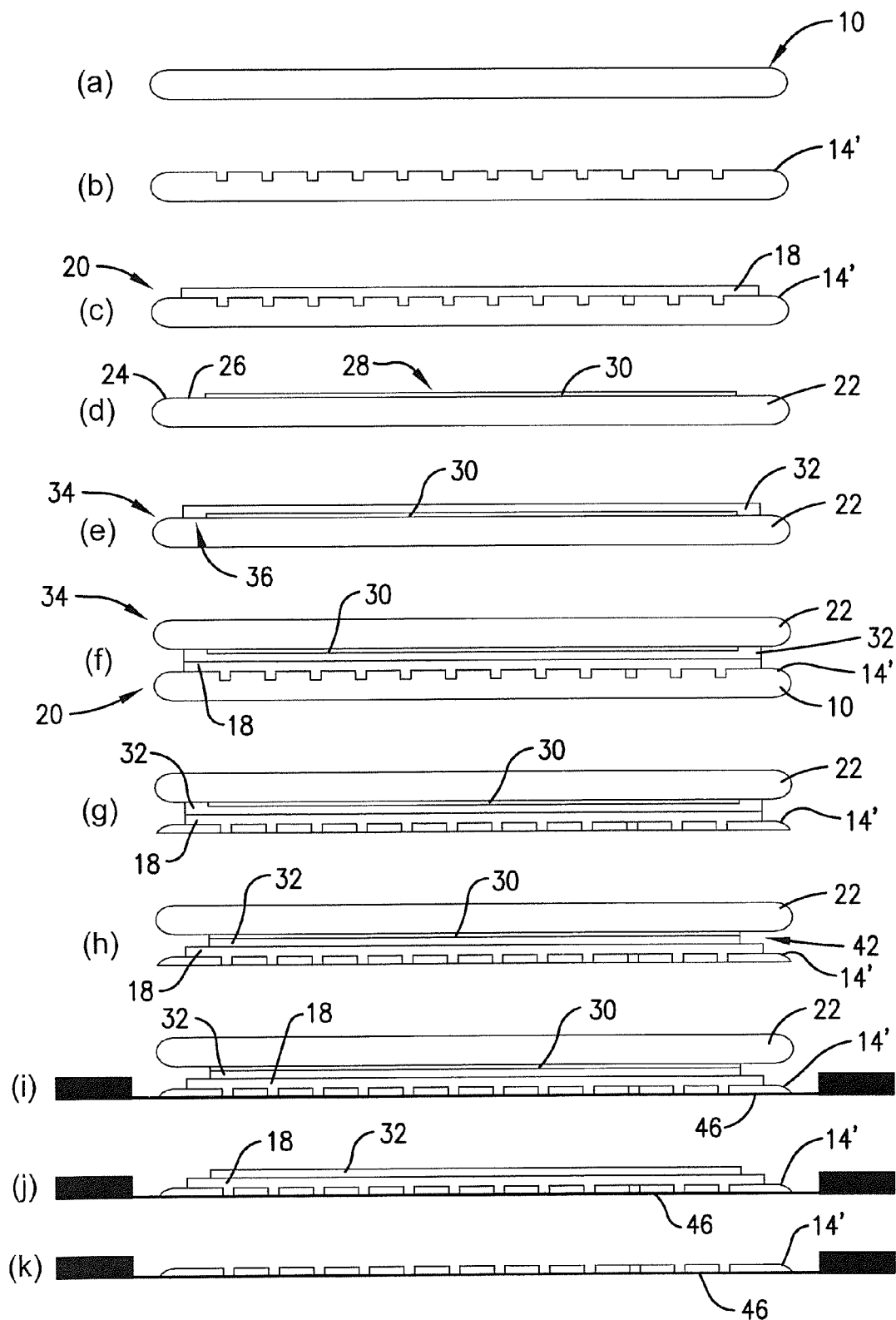
FIG. 3 is a schematic showing yet a further variation of the wafer handling processes of FIGS. 1 and 2.

Yet another alternative embodiment for handling ultrathin layers is shown in FIG. 3. In this instance, the ultrathin layer 14 is a layer of devices with dicing streets 14' already fabricated in layer 10 (see FIG. 3(b)). Again, the embodiment of FIG. 3 uses many of the same parts/compositions/layers as described with respect to FIGS. 1 and 2 above, except that the dicing streets 14' are formed in the surface of the substrate 10 (typically a silicon wafer).

Figure 4:
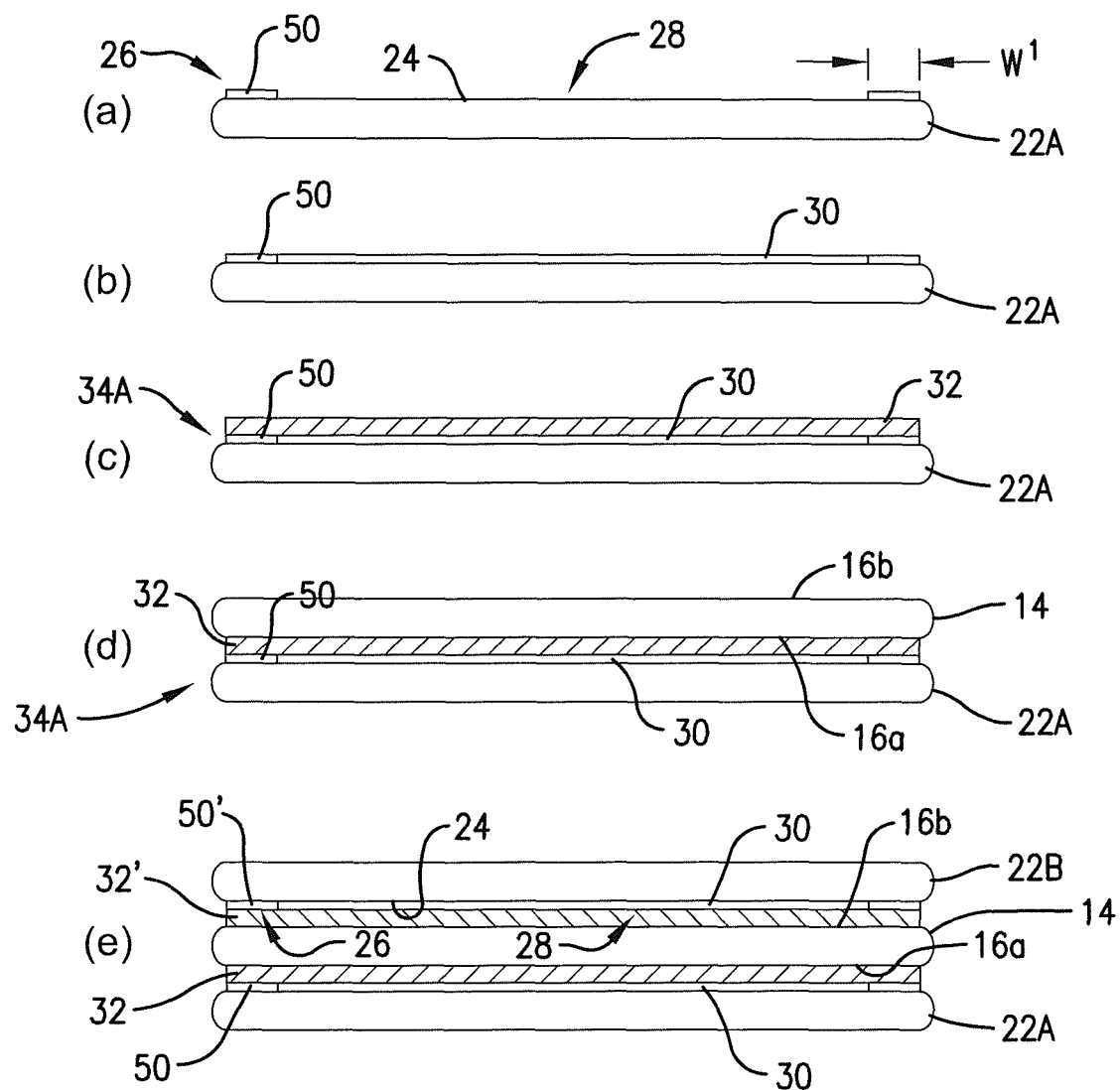
FIG. 4 is a schematic showing an alternative embodiment of the invention that accommodates backside processing of wafers or ultrathin layers.
Figure 5:
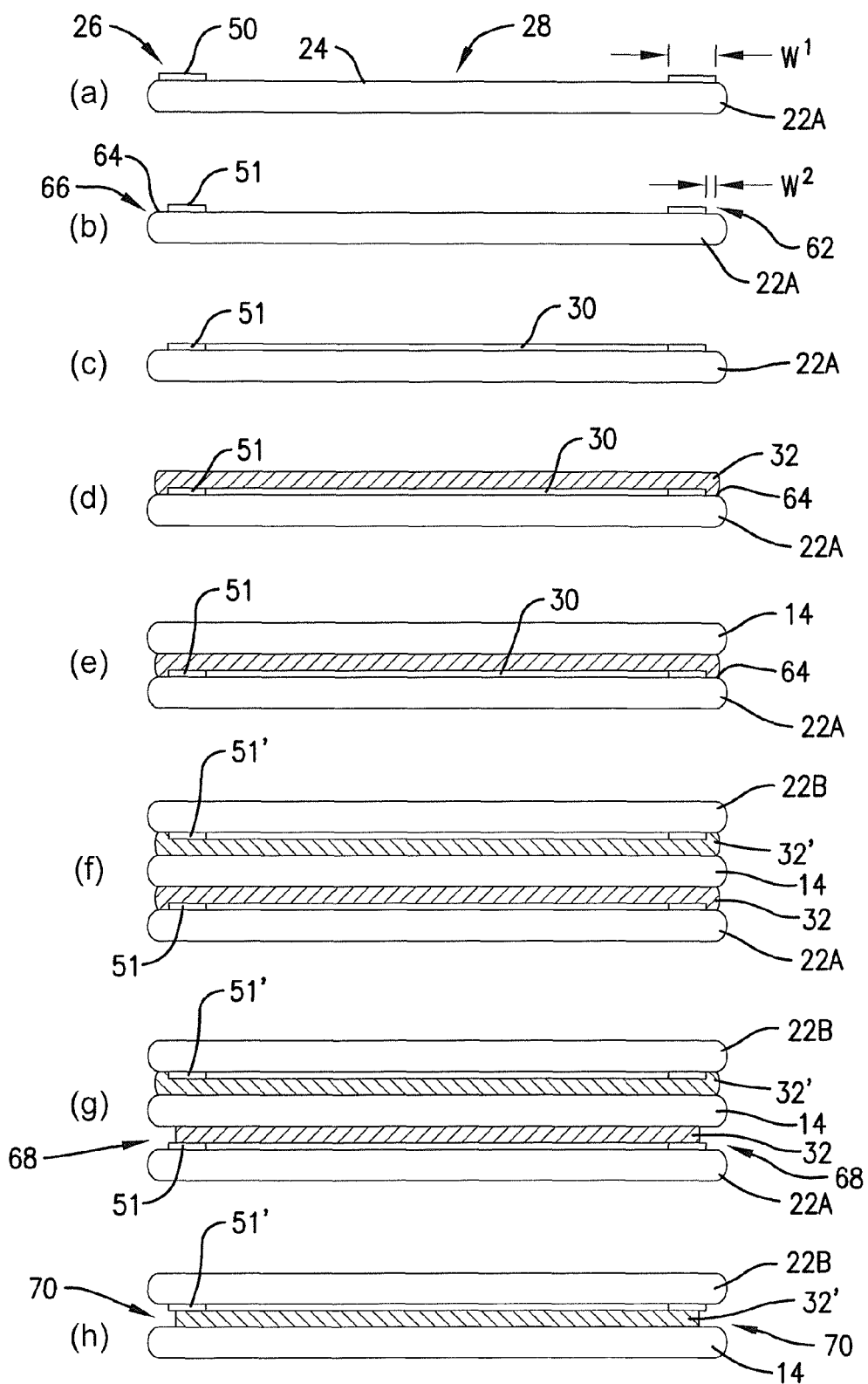
FIG. 5 is a schematic figure showing a variation of the embodiment of FIG. 4.

FIGS. 1-3 illustrated methods of handling and transferring device or other ultrathin layers. FIGS. 4-5 illustrate methods that can also be utilized for handling and transferring of device or other ultrathin layers, but, advantageously, these methods also provide for the processing of both sides of device or other ultrathin layers. Again, like numbering indicates like parts with respect to the previous figures.

Referring to FIG. 4(a), a first carrier 22A is shown. First carrier 22A is similar to that described above with respect to carrier 22, also with optional low stiction zone 30 (FIG. 4(b)). However, in this embodiment of the invention, first carrier 22A includes a first edge mask 50 at its peripheral region 26. First edge mask 50 is similar to bonding composition 32 above. That is, first edge mask 50 should have adhesive properties similar to that described above with respect to bonding composition 32, and similar compositions can be utilized to form first edge mask 50. First edge mask 50 preferably has a width "$W^1$" of from about 0.1 mm to about 10 mm, preferably from about 0.5 mm to about 5 mm, and even more preferably from about 3 mm to about 5 mm. Furthermore, the average thickness of first edge mask 50 will typically be from about 0.1 μm to about 50 μm, and preferably from about 0.1 μm to about 10 μm.

As shown in FIG. 4(c), bonding composition 32 is applied to first carrier 22A to form carrier stack 34A, which is then bonded to first surface 16a of device or ultrathin layer 14, as described above. Alternatively, a reinforcing material 18 can first be formed on first surface 16a of device or ultrathin layer 14 first (not shown), and then the reinforcing material 18/ultrathin layer 14 combination can be bonded to carrier stack 34A. At this point, layer 14 is supported by carrier stack 34A (FIG. 4(d)) and can be subject to any number of processing steps on second surface 16b of layer 14. That processing is not shown in the figures, but it includes any conventional processing steps, including backside grinding, chemical mechanical polishing, via formation, photolithography, plasma etching, and metal deposition.

After the desired processing is carried out on second surface 16b, it is often desirable to process first surface 16a while still supporting the ultrathin or device layer 14. Thus, a second carrier 22B is formed or provided, and bonded to second surface 16b in a similar bonding manner as described previously, resulting in the structure shown in FIG. 4(e). Second carrier 22B is very similar to first carrier 22A and, in fact, can be identical, except that second edge mask 50' is different from first edge mask 50. That is, second edge mask 50' will be chemically different from first edge mask 50 and/or possess different physical properties so that the user can selectively disrupt, destroy, and/or remove one edge mask while preserving the other. This allows one of the first and second carriers 22A, 22B to be removed while not affecting the other of the first and second carriers 22A, 22B. More specifically, first edge mask 50 can be softened, dissolved, removed, etc., as described above with respect to segment 36, thus allowing for first carrier 22A to be separated from the bonded stack. Residual bonding composition 32 can be removed from first surface 16a, and any desired processing can be carried out on first surface 16a. Either with or without such processing, second edge mask 50' can be disrupted in a similar manner as first edge mask 50, thus allowing for separation of second carrier 22B, typically after device or underlayer 14 has been mounted on a support similar to support 46. Additionally, it is possible to disrupt edge mask 50' after mounting on support 46, if desired.

The final embodiment shown in FIG. 5 is similar to that shown in FIG. 4, except that a portion of first edge mask 50 (or 50', in the case of second carrier 22B) is removed to yield a (typically annular) void 62. This will also result in formation of first edge mask 51, which is ring-shaped and spaced inwardly from the outermost edge 64 of carrier surface 24 to leave the void 62. (Outermost edge 64 is the last point at which carrier surface 24 is planar, i.e., before the beginning of the curve 66.) The width "$W^3$" of void 62 will preferably be from about 0.1 mm to about 1 mm, more preferably from about 0.3 mm to about 0.7 mm, and even more preferably about 0.5 mm.

In this embodiment, first edge mask 50 and second edge mask 50' can still be formed of the materials described above, as well as materials selected from the group consisting of poly(vinyl pyridine), developable epoxies, acid strippable polymers, and non-covalently crosslinkable compositions. Suitable non-covalently crosslinkable compositions are described in U.S. Patent Application Publication No. 2009/0035590, incorporated by reference herein. One preferred such composition is sold under the name WGF 300 by Brewer Science, Inc., Rolla, Mo. Formation of void 62 can be accomplished by contacting edge mask 50, 50' with a solvent capable of removing the edge mask material to achieve the above width "$W^2$."

Referring to FIG. 5(d), it will be appreciated that, upon application of bonding composition 32, a portion of that composition will now fill void 62, thus forming an outer ring 64 of material on the carrier surface 24, extending from the first edge mask 51 towards the first outermost edge 64. Thus, it can be seen that the outer ring 64 is formed of a material that is different from that of first edge mask 51, and preferably identical to that of bonding composition 32.

As was the case with the embodiment of FIG. 4, a second carrier 22B is formed in a manner similar to that of first carrier 22A, except that the bonding composition 32' utilized on second carrier 22B is different from that used for first carrier 22A. That is, bonding composition 32' will be chemically different from bonding composition 32 and/or possess different physical properties so that the user can selectively disrupt, destroy, and/or remove bond while preserving the other. Again, this allows one of the first and second carriers 22A, 22B to be removed while not affecting the other of the first and second carriers 22A, 22B. More specifically, bonding composition 32 can be softened, dissolved, removed, etc., at location 68 (see FIG. 5(g)) as described above with respect to first edge mask 50, thus allowing for first carrier 22A to be separated from the bonded stack. Residual bonding composition 32 can be removed from first surface 16a, and any desired processing can be carried out on first surface 16a. Either with or without such processing, bonding composition 32' can be disrupted in a similar manner to that of bonding composition 32 at location 70 (see FIG. 5(h)), thus allowing for separation of second carrier 22B, typically after device or underlayer 14 has been mounted on a support similar to support 46 (not shown). Additionally, it is possible to disrupt bonding composition 32 after mounting on support 46, if desired.

EXAMPLES

The following examples set forth preferred methods in accordance with the invention. It is to be understood, however, that these examples are provided by way of illustration and nothing therein should be taken as a limitation upon the overall scope of the invention.

Example 1

Carrier Transfer Using a Zonal Bonding Approach

A thin layer of WaferBOND® HT-10.10 material (Brewer Science, Inc., Rolla, Mo.) was coated onto the surface of a 200-mm silicon wafer (Carrier A) at the outer edge to coat a section of the wafer surface that was about 3-5 mm wide. This wafer was baked at 110° C. for 2 minutes and then at 160° C. for 2 minutes. A fluorinated silane ((heptadecafluoro-1,1,2,2-tetrahydradecyl) trichlorosilane, obtained from Sigma Aldrich) was diluted to a 1% solution using FC-40 solvent (a perfluoro compound with primarily $C_{12}$, sold under the name Fluorinert™ by 3M). The solution was spin coated onto the surface of Carrier A, followed by baking on a hot plate at 100° C. for 1 minute. It was then rinsed with FC-40 solvent in a spin coater and baked at 100° C. for an additional 1 minute.

The device surface of another 200-mm silicon wafer was coated with Bonding Composition A (a cyclic olefin-type bonding material available under the name ZoneBOND® 5150-30 from Brewer Science, Inc., Rolla, Mo.) via spin coating. This wafer was baked at 80° C. for 2 minutes, then at 120° C. for 2 minutes, and finally at 220° C. for 2 minutes. The coated wafers were bonded by joining the coated surface of Carrier A with the coated device side of the device wafer under vacuum at 220° C. for 3 minutes in a heated vacuum and pressure chamber.

A thin layer of Bonding Composition A was coated onto the surface of a 200-mm silicon wafer (Carrier B) at the outer edge to coat an annular section of the wafer surface that was about 3-5 mm wide (thickness of the ring). This wafer was baked at 80° C. for 2 minutes, then at 120° C. for 2 minutes, and finally at 220° C. for 2 minutes. The fluorinated silane ((heptadecafluoro-1,1,2,2-tetrahydradecyl) trichlorosilane) that was diluted to a 1% solution using FC-40 solvent was spin coated onto the surface of Carrier B. Carrier B was baked on a hot plate at 100° C. for 1 minute. It was rinsed with FC-40 solvent in a spin coater and baked at 100° C. for an additional 1 minute.

The backside of the device wafer bonded to Carrier A was coated with Bonding Composition A via spin coating. This wafer was baked at 80° C. for 2 minutes, then at 120° C. for 2 minutes, and finally at 220° C. for 2 minutes. Finally, Carrier B and the device wafer backside were bonded by joining the coated surface of Carrier B with the coated backside of the device wafer under vacuum at 220° C. for 3 minutes in a heated vacuum and pressure chamber.

The carrier-wafer-carrier stack was soaked in 1-dodecene to soften the thin layer of WaferBOND® HT-10.10 material at the edge of Carrier A, while not affecting the Carrier B edge adhesive. Carrier A was separated from the assembly using a ZoneBOND™ wafer separation tool. This completed the transfer of the device wafer from one carrier to another. Further, the device wafer was separated from Carrier B in a similar manner using a solvent compatible with Bonding Composition A.

Example 2

Using Multiple Layers to Assist in Edge Cutting

A layer of WaferBOND® HT-10.10 that was 1-μm thick and 3-5 mm wide was coated onto the surface of a 200-mm silicon wafer (carrier) at the outer edge. This wafer was baked at 110° C. for 2 minutes followed by 160° C. for 2 minutes. A fluorinated silane ((heptadecafluoro-1,1,2,2-tetrahydradecyl) trichlorosilane) was diluted to a 1% solution using FC-40 solvent. The solution was spin coated onto the center section of the carrier. The carrier was baked on a hotplate at 100° C. for 1 minute, rinsed with FC-40 solvent in a spin coater, and baked on a hotplate at 100° C. for an additional 1 minute.

The surface of another 200-mm silicon wafer (device) was coated with a bonding composition (a cyclic olefin-type composition, available from Brewer Science Inc., Rolla, Mo.) via spin coating. This wafer was baked at 80° C. for 2 minutes, followed by 120° C. for 2 minutes, and finally at 220° C. for 2 minutes. The device and carrier were bonded in a face-to-face relationship under vacuum at 220° C. for 3 minutes in a heated vacuum and pressure chamber.

The assembly was soaked in 1-dodecene to soften and partially dissolve the thin layer of WaferBOND® HT-10.10 at the edge of the carrier. The 1-dodecene did not affect the bulk of the experimental bonding composition, only the WaferBOND® HT-10.10. Since the WaferBOND® HT-10.10 was only a very thin layer, the required time was much shorter than the time required to edge cut the bulk adhesive. This illustrated that an "edge-only" bonding composition could be selectively disrupted without impacting other bonding compositions. The carrier was separated from the assembly using a ZoneBOND™ separation tool.

Example 3

Using Reactive Material to Increase Removal of Outer Stiction Material

In this Example, 2 grams of poly(vinyl pyridine) (PVP, Sigma-Aldrich, St Louis, Mo., USA) were dissolved in cyclopentanone. The solution was allowed to stir at room temperature until the polymer dissolved. The total weight concentration of PVP in cyclopentanone was 2%. The solution was filtered through a 0.1-μm filter. A thin layer, (approximately 1-μm thick) of the PVP solution was coated onto the surface of a 200-mm silicon wafer (Carrier A) at the outer edge to coat a section of the wafer surface that was about 3-5 mm wide. Cyclopentanone was then dispensed at the outermost edge of Carrier A to remove about 0.5-mm of the PVP from the wafer edge. This wafer was baked at 110° C. for 2 minutes and then at 160° C. for 2 minutes. A fluorinated silane ((heptadecafluoro-1,1,2,2-tetrahydradecyl) trichlorosilane) was diluted to a 1% solution using FC-40 solvent. The solution was spin coated at the center of Carrier A. Then Carrier A was baked on a hot plate at 100° C. for 1 minute. It was then rinsed with FC-40 solvent in a spin coater and baked at 100° C. for an additional 1 minute.

The device surface of another 200-mm silicon wafer (device wafer) was coated with an approximately 20-μm thick layer of WaferBOND® HT-10.10 via spin coating. This wafer was baked at 110° C. for 2 minutes, followed by 180° C. for 2 minutes. The coated wafers were bonded by joining the coated surface of Carrier A with the coated device side of the device wafer under vacuum at 180° C. for 3 minutes in a heated vacuum and pressure chamber using commercially available bonder.

A second carrier wafer (Carrier B) was then manufactured in the same manner as Carrier A. Next, the backside of the device wafer bonded to Carrier A was coated with an approximately 20-μm thick layer of a cyclic olefin-type bonding material (available from Brewer Science, Inc., Rolla, Mo.) via spin coating. This wafer was baked at 80° C. for 2 minutes, then at 120° C. for 2 minutes, and finally at 220° C. for 2 minutes. Finally, Carrier B and the device wafer backside were bonded by joining the coated surface of Carrier B with the coated backside of the device wafer under vacuum at 220° C. for 3 minutes in a heated vacuum and pressure chamber using a commercially available bonder.

The carrier-wafer-carrier stack was soaked in WaferBOND® Remover (Brewer Science, Inc., Rolla, Mo.) to soften the WaferBOND® HT-10.10 material at the edge of the stack and expose the PVP on Carrier A, while not affecting the Carrier B edge adhesive. The stack was then soaked in 1% hydrochloride (HCl) aqueous solution at room temperature for about 4 to 5 hours to remove the PVP from Carrier A. Carrier A was separated from the assembly using a ZoneBOND™ wafer separation tool. This completed the transfer of the device wafer from Carrier A to Carrier B. Further, the device wafer was then separated from Carrier B in a similar manner using r-limonene (a solvent compatible with the bonding composition) to expose the PVP. It was then soaked in 1% hydrochloride (HCl) aqueous solution at room temperature for about 4 to 5 hours to remove the PVP from Carrier B. Carrier B was separated from the device using a ZoneBOND™ wafer separation tool.

Example 4

Rigid Layer Coupled with Adhesive

A 20-μm support layer of polysulfone (Ultrason S3010, BASF Corporation, Florham Park, N.J.) was coated onto the top surface of a 100-mm diameter silicon wafer (simulated device wafer) by spin coating at 900 rpm with a 3000-rpm/sec ramp for 30 seconds. This device wafer was baked at 100° C. for 1 minute, followed by 150° C. for 1 minute and then at 250° C. for 5 minutes. A polyhydroxyether bonding composition (available from Brewer Science Inc., Rolla, Mo.) was coated onto this support layer by spin coating at 60 rpm with a 3000-rpm/sec ramp for 5 seconds, followed by spinning at 500 rpm with a 500-rpm/sec ramp for 5 seconds, and then followed by spinning at 1,000 rpm with a 3,000-rpm/sec ramp for 30 seconds. The device wafer was baked at 100° C. for 2 minutes, followed by 150° C. for 2 minutes, and then at 205° C. for 5 minutes. A methoxy silane release composition (available from Brewer Science Inc., Rolla, Mo.) was spin coated onto the top surface of another 100-mm silicon carrier wafer. This carrier was baked on a hotplate at 205° C. for 2 minutes. The device and carrier were bonded in a face-to-face relationship with the coated sides toward each other, under vacuum at 220° C. and 3,500 N for 3 minutes. The sample was heat-treated for stress testing at 250° C. for 1 hour. It was then laminated to a dicing frame with the device wafer towards the lamination tape. The carrier was separated from the assembly using a Brewer Science® ZoneBOND™ Separation Tool. The adhesive was stripped using a cyclopentanone solvent blend, specifically developed for the bonding composition being tested. Finally, the support layer was removed from the device by rinsing with cyclopentanone.

Example 5

Rigid Layer for Support of 30-μm Thick Silicon Wafer

A 20-μm support layer of polysulfone (Ultrason S3010) was coated onto the top surface of a 200-mm diameter silicon wafer (simulated device wafer) by spin coating at 60 rpm with a 3,000 rpm/sec ramp for 5 seconds, followed by spinning at 500 rpm with a 500 rpm/sec ramp for 5 seconds, followed by a spin at 1,000 rpm with a 3,000 rpm/sec ramp for 30 seconds. This wafer was then baked at 100° C. for 1 minute followed by 150° C. for 1 minute followed by 250° C. for 5 minutes. The device was bonded in a face-to-face relationship to a virgin, 200-mm diameter silicon wafer with the support layer in between using the polysulfone as the adhesive itself while under vacuum at 350° C. and 3,500 N for 3 minutes. The device wafer was thinned to 30 μm by Disco Hi-Tec America Inc. in Santa Clara, Calif. The sample was heat treated for stress testing at 300° C. for 1 hour. The wafer stack was reviewed by scanning acoustic microscopy for voids or delaminations, and none were observed. This Example demonstrated successful device layer adhesion and mechanical stability improvement or enhancement by a polymeric support layer.

We claim:

1. A method of handling ultrathin layers, said method comprising:
   providing an active stack bonded with a carrier stack, wherein
      said active stack comprises:
         a growth substrate having front and back surfaces;
         an ultrathin layer having first and second surfaces, said first surface of said ultrathin layer being in contact with said front surface of said growth substrate; and
         a rigid layer of reinforcing material adjacent said second surface of said ultrathin layer; and
      wherein said carrier stack comprises:
         a carrier substrate having a carrier surface, a peripheral region, and a central region; and
         a bonding composition adjacent said carrier surface, wherein said bonding composition of said carrier stack is in contact with said reinforcing material of said active stack; and
   a step of separating said growth substrate from said ultrathin layer.

2. The method of claim 1, said carrier stack further comprising a low stiction zone on said carrier surface, said bonding composition being on said low stiction zone.

3. The method of claim 2, wherein said low stiction zone comprises a carrier surface modification, a low adhesive strength area, or a fill layer.

4. The method of claim 1, further comprising mounting said first surface of said ultrathin layer to a support.

5. The method of claim 4, wherein said support is selected from the group consisting of film frames, final substrates, temporary carriers, vacuum chucks, and electrostatic chucks.

6. The method of claim 4, further comprising removing said bonding composition at said peripheral region prior to said mounting.

7. The method of claim 4, further comprising removing said bonding composition at said peripheral region after said mounting.

8. The method of claim 1, further comprising removing said carrier substrate.

9. The method of claim 8, further comprising removing any remaining bonding composition and reinforcing material from said ultrathin layer.

10. The method of claim 1, wherein said growth substrate is made of a material selected from the group consisting of sapphire, silicon, gallium arsenide, germanium, and silicon carbide.

11. The method of claim 1, wherein said ultrathin layer is selected from the group consisting of epitaxial layers, device layers, dicing streets, and graphene.

12. The method of claim 1, wherein said reinforcing material is selected from the group consisting of polysulfones, polyimides, acrylates, polyacrylates, polyhydroxyethers, polyurethanes, urethanes, polyethersulfones, and composites of the foregoing.

13. The method of claim 1, wherein said bonding composition is selected from the group consisting of cyclic olefin polymers and copolymers; high solids, UV-curable resin systems; acrylic, styrenic, vinyl halide, and vinyl ester polymers and copolymers; polyamides; polyimides; polysulfones; polyethersulfones; and polyurethanes.

14. The method of claim 1, wherein said carrier substrate is selected from the group consisting of sapphire, silicon, gallium arsenide, germanium, silicon carbide, glass, metals, and composites of the foregoing.

15. The method of claim 1, wherein said providing an active stack bonded with a carrier stack comprises forming said ultrathin layer on said growth substrate and then depositing said reinforcing material on said ultrathin layer.

16. The method of claim 15, wherein said providing an active stack bonded with a carrier stack comprises applying said bonding composition to said reinforcing material.

17. The method of claim 16, wherein said providing an active stack bonded with a carrier stack comprises bonding said carrier substrate to said bonding composition after said bonding composition has been applied to said reinforcing material.

18. The method of claim 1, wherein said providing an active stack bonded with a carrier stack comprises bonding said active stack to said carrier stack after each of said stacks has been independently formed.

19. The method of claim 1, wherein said reinforcing material comprises a single layer of material.

20. A structure comprising an active stack bonded with a carrier stack, wherein:
   said active stack comprises:
      a growth substrate having front and back surfaces;
      an ultrathin layer having first and second surfaces, said first surface of said ultrathin layer being in contact with said front surface of said growth substrate; and
      a rigid layer of reinforcing material adjacent said second surface of said ultrathin layer; and
   said carrier stack comprises:
      a carrier substrate having a carrier surface, a peripheral region, and a central region; and
      a bonding composition adjacent said carrier surface, wherein said bonding composition of said carrier stack is in contact with said reinforcing material of said active stack.

21. The structure of claim 20, said carrier stack further comprising a low stiction zone on said carrier surface, said bonding composition being on said low stiction zone.

22. The structure of claim 21, wherein said low stiction zone comprises a carrier surface modification, a low adhesive strength area, or a fill layer.

23. The structure of claim 20, wherein said growth substrate is made of a material selected from the group consisting of sapphire, silicon, gallium arsenide, germanium, and silicon carbide.

24. The structure of claim 20, wherein said ultrathin layer is selected from the group consisting of epitaxial layers, device layers, dicing streets, and graphene.

25. The structure of claim 20, wherein said reinforcing material is selected from the group consisting of polysulfones, polyimides, acrylates, polyacrylates, polyhydroxyethers, polyurethanes, urethanes, polyethersulfones, and composites of the foregoing.

26. The structure of claim 20, wherein said bonding composition is selected from the group consisting of cyclic olefin polymers and copolymers; high solids, UV-curable resin systems; acrylic, styrenic, vinyl halide, and vinyl ester polymers and copolymers; polyamides; polyimides; polysulfones; polyethersulfones; and polyurethanes.

27. The structure of claim 20, wherein said carrier substrate is selected from the group consisting of sapphire, silicon, gallium arsenide, germanium, silicon carbide, glass, metals, and composites of the foregoing.

28. The structure of claim 20, wherein said reinforcing material comprises a single layer of material.

\* \* \* \* \*